United States Patent [19]

Tshudy et al.

[11] 4,004,954
[45] Jan. 25, 1977

[54] METHOD OF SELECTIVE GROWTH OF MICROCRYSTALLINE SILICON

[75] Inventors: Donald Richard Tshudy, Lancaster; Thomas William Edwards, Mount Joy, both of Pa.

[73] Assignee: RCA Corporation, New York, N.Y.

[22] Filed: Feb. 25, 1976

[21] Appl. No.: 661,400

[52] U.S. Cl. .................. 148/174; 29/578; 148/175; 148/188; 357/30; 357/31; 357/59; 427/86

[51] Int. Cl.² ............... H01L 21/205; H01L 31/14

[58] Field of Search ............ 148/174, 175, 188; 357/30, 31, 59; 29/578; 156/612; 427/86

[56] References Cited

UNITED STATES PATENTS

| | | | |
|---|---|---|---|
| 3,265,542 | 8/1966 | Hirshon | 148/175 |
| 3,386,857 | 6/1968 | Steinmaier | 148/175 X |
| 3,425,879 | 2/1969 | Shaw et al. | 148/175 |
| 3,511,702 | 5/1970 | Jackson et al. | 148/174 X |
| 3,519,901 | 7/1970 | Bean et al. | 148/174 X |
| 3,548,233 | 12/1970 | Cave et al. | 357/31 X |
| 3,663,319 | 5/1972 | Rose | 148/175 |
| 3,746,908 | 7/1973 | Engeler | 357/31 X |
| 3,884,733 | 5/1975 | Bean | 148/175 |

OTHER PUBLICATIONS

Dumin, D. J., "Selective Epitaxy using Silane and Germane" J. Crystal Growth, vol. 8, No. 1, 1971, pp. 33–36.
Rai-Choudhvry et al., "Selective Growth of Epitaxial Silicon and Gallium Arsenide" J. Electrochem. Soc., vol. 118, No. 1, Jan. 1971, pp. 107–110.
Blumenfeld et al., "Epicon Camera Tube; an Epitaxial Diode Array Vidicon" IEEE Trans. on Electron Devices, vol. ED–18, No. 11, Nov. 1971, pp. 1036–1042.

*Primary Examiner*—C. Lovell
*Assistant Examiner*—W. G. Saba
*Attorney, Agent, or Firm*—G. H. Bruestle; R. J. Boivin

[57] ABSTRACT

An array of microcrystalline silicon pads for a vidicon target is selectively grown, by the hydrogen reduction of silicon tetrachloride, along surface portions of a silicon wafer exposed through openings in an overlying silicon dioxide layer. The method disclosed avoids the spurious irregular growth of silicon on the silicon dioxide layer between the adjacent silicon pads.

12 Claims, 2 Drawing Figures

METHOD OF SELECTIVE GROWTH OF MICROCRYSTALLINE SILICON

BACKGROUND OF THE INVENTION

The invention relates to silicon devices including a diode array target and to the selective growth of microcrystalline silicon pads for the diode arrays of such targets.

One type of silicon device is a silicon target for a vidicon type camera tube. Such targets are well known in the art and are described, for example, in U.S. Pat. No. 3,548,233 issued to E. F. Cave et al on Dec. 15, 1970. In the manufacture of such targets, one or more complicated and costly etching procedures, employing photoresist techniques, is required to produce an array of pads which is in registration with discrete regions of an underlying diode array. A simplified and less complicated manufacturing technique for such targets is desired.

One diode array target which may be manufactured by a simplified process to include an array of diodes having a self-registered conducting pad or overlayer by the hydrogen reduction of silicon tetrachloride is described in an article entitled "The Epicon Camera Tube: An Epitaxial Diode Array Vidicon" by S. M. Blumenfeld, G. W. Ellis, R. W. Redington and R. H. Wilson in IEEE Transactions on Electron Devices, Vol. ED-18, No. 11, November, 1971. Such targets include conducting pads for the diodes of the array which are the result primarily of single crystalline epitaxial growth. Unfortunately these pads produced by the hydrogen reduction of silicon tetrachloride include imperfections or variations in faceting of the crystalline structure which, because of the large crystalline size in excess of several microns, results in a variation in electron beam acceptance across the target's electron beam scanned surface. These imperfections or variations produce a distortion or noise in the image detected by the camera tube within which such a target is incorporated.

A target structure permitting simplified manufacture and having diode pads which do not include electron beam detectable imperfections is desired.

SUMMARY OF THE INVENTION

An array of microcrystalline silicon pads is selectively grown, by the hydrogen reduction of silicon tetrachloride, along surface portions of a silicon wafer exposed through openings in an overlying insulating layer. However, the insulating layer is first subjected to thermal processing, prior to such selective growth, at a temperature above the selective growth temperature in a continually renewed atmosphere comprising hydrogen for a period of time which is effective for avoiding spurious irregular growth of silicon of the insulating layer between the subsequently grown silicon pads.

DESCRIPTION OF THE PREFERRED EMBODIMENTS

General Structure

Figure 1:
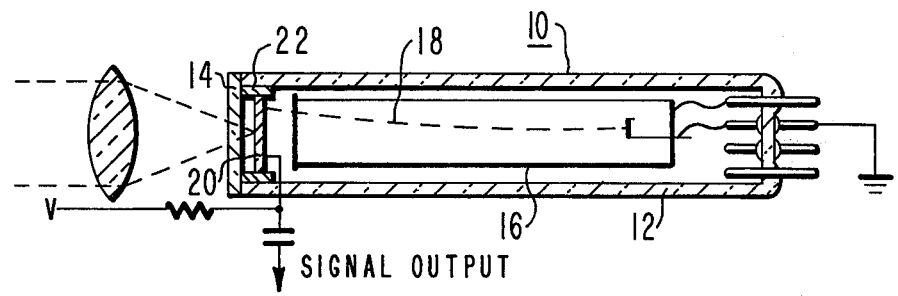
FIG. 1 is a cross-sectional cut-away view of a vidicon type camera tube incorporating a target fabricated in accordance with the invention.

A preferred embodiment of the invention is a vidicon type camera tube 10 as shown in FIG. 1 having an evacuated envelope 12 and including a transparent faceplate 14 at one end of the envelope 12, and an electron gun assembly 16 inside the envelope for forming a low velocity electron beam 18. An input signal sensing element or target 20, mounted on a ceramic spacer 22, is positioned adjacent the inside surface of the faceplate 14 in a manner suitable for receiving a light input image signal. Means (not shown) for magnetically focusing the beam 18 toward the target 20 and for causing the beam 18 to scan the surface of the target 20 may be disposed outside the envelope 12.

Figure 2:
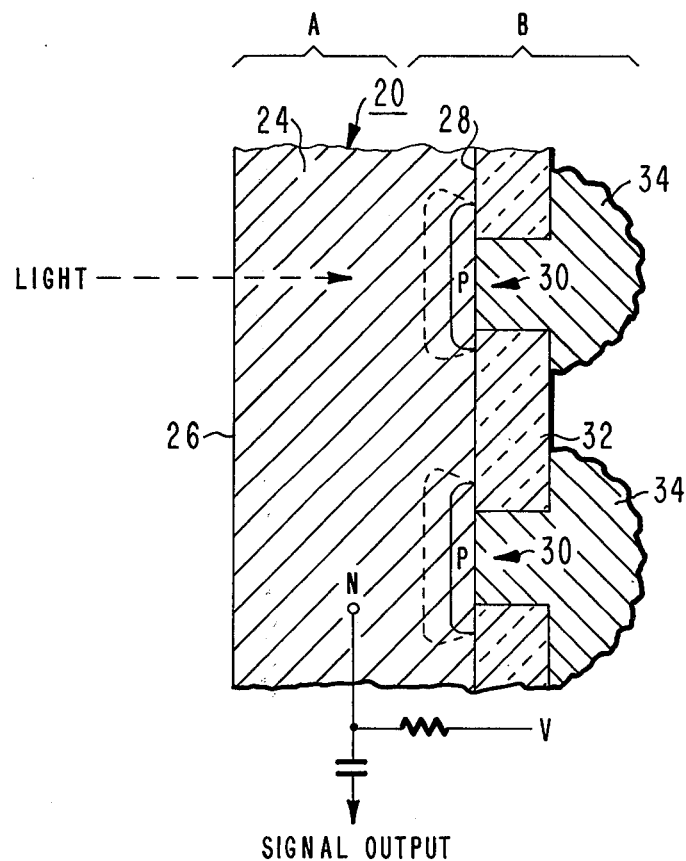
FIG. 2 is a partial cross-sectional view of the target of the camera tube depicted in FIG. 1.

The photon-excitable target 20, a fragment of which is shown in FIG. 2, includes a silicon wafer 24 having a bulk region of a single crystal of elemental silicon which is suitably doped N type with, for example, phosphorous to a level of about $2 \times 10^{13}$ atoms/cm$^3$ to about $10^{16}$ atoms/cm$^3$. The silicon wafer 24 includes first and second opposed major surfaces 26 and 28, respectively. The first major surface 26 comprises the input signal sensing surface of the target 20 for receiving an input light image. The second major surface 28 faces the electron beam, when mounted in the tube of FIG. 1, and is referred to, for simplicity, as the scan surface of wafer 24.

The wafer 24 includes a charge storage region B along a surface portion including the scan surface 28, and an input surface region A along the surface portion including the input signal sensing surface 26. The charge storage region B includes, on the scan surface 28 of the silicon wafer 24, an array of discrete PN junction storage diodes 30. An insulating layer 32 of silicon dioxide is provided on the scan surface 28 between the discrete diodes 30 to shield the bulk 24 from the effects of the scanning electron beam 18. Degenerately doped microcrystalline contact pads 34 of P-type silicon are provided which cover the P-type surfaces of the discrete diodes 30 and overlap the insulating layer 32 about the periphery of the discrete diodes 30. Such pads 34 improve the contacts of the scanning beam 18 with the diodes 30.

The contact pads 34 appear substantially as an array of discrete hemispherical "berry-shaped" projections along the insulating layer 32. In order to avoid variations in electron beam acceptance along the electron beam scanned surface of the target 20, the surface morphology and uniformity of the contact pads 34 must be carefully controlled. In particular, the contact pads 34 must include silicon crystallites which are small in comparison with the electron beam resolving capability of the tube. In this regard, we have found that the crystallite size of the contact pads 34 must be less than about 1 micron (i.e. the pads must be "microcrystalline") to substantially avoid the aforementioned imperfections in the detected image. Furthermore, as the hemispherically shaped contact pads 34, of the type described, are selectively grown along the exposed surface of the silicon wafer within discrete openings in the insulating layer 32, the technique of selective growth employed must avoid spurious growth of silicon caps along the insulating layer 32, between adjacent contact pads 34. It has been found that such spurious growth also results in an undesired variation in electron beam acceptance of the target 20 and/or an undesired shorting of the adjacent diodes.

Fabrication

The target 18 may be fabricated to include an array of self registered contact pads having the desired surface morphology by the following process: A round, single crystal wafer of very high purity silicon having a diameter of about 1.0 inch and a thickness of about 0.005 inches is first cleaned in an acid solution, rinsed and thereafter dried in a manner well known in the art.

A silicon dioxide insulating layer 32 about 1.5 microns thick is then grown on one major surface 28 of the wafer workpiece by heating it for about four hours at about 1100° C. in an atmosphere of steam. Using well known photolithographic techniques, an array of openings about 7 microns in diameter with a spacing of about 13.8 microns from center to center is etched through the insulating layer to expose discrete areas of the wafer surface. Thereafter, the wafer workpiece is placed on a susceptor block in a chamber of quartz water cooled reactor having an interior volume of approximately 1.2 liters. Tubular openings are provided into the quartz reactor for introducing and subsequently removing gases on vapors from the reactor chamber. A source of reactant gases and/or vapors and a source of dopant are interconnected to an input opening of the reactor. The source of reactant gases or vapors comprises a source of substantially pure hydrogen interconnected with an interruptable source of silicon tetrachloride vapor ($SiCl_4$) and a suitable dopant gas or vapor such as, for example, boron tribromide. The flow of hydrogen directly to the reactor chamber and to the reactant and dopant source(s) is controlled by separate meter flow valves in a manner well known in the art. Other suitable p type or n type (with the modified structure later described) dopant gas or vapor may be employed to advantage in lieu of boron tribromide in a manner well known in the art. Suitable p type dopants include, for example, $BCl_3$ or $B_2H_6$. Suitable n type dopants include, for example, $PH_3$, $PCl_3$, $PB_{r3}$, or $A_sH_3$.

The source of hydrogen gas to the reactor is now turned on to flush the interior of the reactor. Hydrogen gas is introduced to the reactor chamber at a rate corresponding to 5 volumes of the reactor chamber per minute. The wafer workpiece is then heated, by RF heating methods, for example, to a temperature of at least 1000° C. for a period exceeding one minute in order to subject the silicon wafer workpiece to thermal processing necessary for avoiding the spurious growth previously described. The thermal processing of the workpiece in hydrogen serves to decrease the active sites available for nucleation and growth along the oxide layer 32. Preferably, the wafer workpiece is heated or baked at a temperature of about 1050° C. for a period of about 3 minutes in the flushing hydrogen atmosphere described. The temperature of the wafer workpiece during fabrication may be monitored by an optical pyrometer, or a thermocouple within the susceptor block, in a manner well known in the art. While the above-noted heat treatment of the wafer workpiece is preferably accomplished in an atmosphere consisting of hydrogen, other gas(es) which do not interfere with the reaction of hydrogen with the surface of layer 32, and the later described selective growth of silicon, may be employed in conjunction with such hydrogen.

Once the previous heat treatment of the wafer workpiece is accomplished, the temperature of the wafer workpiece in the reactor is lowered to a temperature below that of the previous baking step, but above about 900° C., and a vapor stream of reactants is introduced into the reactor, suitable for selectively growing the desired microcrystalline silicon pads 34 within the openings or apertures previously formed in the silicon dioxide layer 32. A temperature of the wafer workpiece of about 950° C. has been found to be particularly desirable during the period of time of selective growth. The vapor stream of reactants being introduced into the reactor chamber during that period comprises silicon tetrachloride vapor which is introduced into the hydrogen stream, previously established through the reactor chamber. The concentration of silicon tetrachloride preferably is about 0.50 mole percent of the vapor stream into the reactor chamber. Other concentrations of silicon tetrachloride in the vapor stream may be employed to advantage such as from about 0.1 to about 1.0 mole percent of the vapor stream to the reactor chamber. A vapor or gas of a suitable dopant is also simultaneously introduced into the vapor stream during the period of selective growth. If the dopant is boron tribromide, the rate of introduction of the dopant vapor into the vapor stream through the reactor is adjusted to degeneratively dope the contact pads 34 which are selectively grown, at a concentration on the order of about $10^{19}$ atoms per cubic centimeter. Selective growth of the silicon pads 34, within the array of openings previously formed in the silicon dioxide layer 32, occurs and is continued for a period of about 9 minutes. Thereafter, the source of silicon tetrachloride and dopant vapor into the vapor stream is turned off and the wafer workpiece is allowed to cool to room temperature in a flushing atmosphere substantially of pure hydrogen.

The wafer workpiece is now removed from the reactor and placed in a diffusion furnace. The wafer workpiece is baked at a temperature of about 1100° C. in an atmosphere of nitrogen and oxygen for a period of time sufficient to diffuse the dopant in the pads 34 into the silicon wafer 24 to form P type discrete regions therein. These discrete regions from PN junctions with the bulk of the wafer 24 and extend into the wafer 24 a distance of about 3 microns. The input signal sensing surface 26 of the target 20 is then etched chemically until the wafer thickness is about 15 microns. A thicker region may be retained around the periphery for structural support. The target 20 is thereafter rinsed and dried in a manner well known in the art.

The light receiving surface 26 of the target 20 may now be supplied with antireflective, transparent coating in a manner well known in the art to improve the optical coupling between the target 20 and any associated optics such as the faceplate 14 of the vidicon 10. It may also be provided with an N+ type accumulation region to reduce surface recombination at the input signal sensing surface 26.

Targets 20 manufactured in this manner are thereafter mounted adjacent the inside surface of faceplate 14, with the array of contact pads 34 facing the electron beam 18.

General Considerations

While the preferred embodiment of the invention relates to a vidicon, the invention may be employed for other types of devices which have targets having an array of contact pads addressed by an electron beam. Such devices, may for example, comprise silicon intensifier tubes and storage tubes. The various constructions, modes of operation of the present invention as one of such devices, and the voltages to be applied for such modes are well known to those skilled in the art. For instance, in the secondary emission mode of operation for a vidicon type camera tube, the conductivity type of the discrete P regions and the N-type bulk region of the wafer 24 are reversed, so that the discrete regions are made N-type whereas the bulk region of the wafer 24 is P-type.

The terminology "selective growth" as herein employed, refers to the substantially uniform growth of silicon along discrete surface regions of a silicon wafer which are exposed through an array of openings in an overlying layer, in which growth of silicon along the layer between the discrete arrayed regions of silicon growth is substantially avoided. It has been found that in the selective growth of silicon, using the hydrogen reduction of silicon tetrachloride, irregular growth of silicon along the insulating layer between the discrete arrayed regions of silicon growth generally occurs which is unacceptable in the manufacture of targets which are to be scanned by an electron beam. It has been found that if a wafer workpiece is subjected during fabrication to a simple thermal processing step in an atmosphere comprising hydrogen prior to selective growth in an $SiCl_4$ system, such spurious growth may be substantially avoided. Furthermore, it has been found that electron beam detectable irregularities in the contact pads which are selectively grown may also be avoided by careful process control in which a substantially uniform microcrystalline form of silicon is selectively grown. More specifically, the microcrystalline pads produced by the method disclosed avoids irregular faceting normally associated with single crystal silicon growth, especially on 111 oriented wafer substrates. In addition, precise cutting of the silicon wafer crystal is not required, nor is any special alignment of the pattern in the overlying apertured layer relative to any crystallographic axis required.

What we claim is:

1. A method of selectively growing microcrystalline silicon on an array of discrete surface regions of a silicon wafer exposed through an array of openings in a layer overlying said wafer, in which the method employs the hydrogen reduction of silicon tetrachloride, the method including the preliminary step of:

baking the overlying layer at a temperature above the selective growth temperature in an enclosed chamber and in a flushing atmosphere comprising hydrogen for a period of time effective for substantially avoiding spurious irregular growth along the insulating layer between discrete regions of subsequent selective growth.

2. The method of claim 1, wherein said layer is silicon dioxide.

3. The method of claim 2, wherein the baking temperature is at least 1000° C.

4. The method of claim 3, wherein the flushing rate of said atmosphere through said enclosed chamber during said baking step is at a rate of about 5 interior volumes of the enclosed chamber per minute.

5. The method of claim 4, wherein the temperature during said selective growth is about 950° C. and the temperature during said baking step is about 1050° C.

6. A method of selective growth of microcrystalline silicon on an array of discrete surface regions of a silicon wafer exposed through an array of openings in a layer overlying said wafer, the method including the steps of:

a. preheating the wafer and overlying layer to a temperature above 1000° C. in an enclosed chamber in a continually renewed atmosphere comprising hydrogen for at least one minute; and thereafter, b. selectively growing mircrocrystalline silicon on the discrete surface regions of the silicon wafer by the hydrogen reduction of silicon tetrachloride at a temperature below said preheat temperature.

7. The method of claim 7, wherein said wafer and insulating layer are placed within a reactor chamber, during said selective growth step, having a continually renewed atmosphere primarily of hydrogen and having from about 0.1 to about 1.0 mole percent of silicon tetrachloride vapor.

8. The method of claim 7, wherein said continually renewed chamber atmosphere during said selective growth step includes a dopant.

9. The method of claim 8, wherein said dopant is boron tribromide.

10. The method of claim 9, wherein the temperature during said selective growth step is about 950° C.

11. The method of claim 10, wherein the temperature during said preheating step is about 1050° C.

12. The method of claim 11, wherein said preheat step is continued for a period of about 3 minutes.

* * * * *